United States Patent
Lee et al.

(10) Patent No.: US 6,459,636 B2
(45) Date of Patent: Oct. 1, 2002

(54) MODE SELECTION CIRCUIT FOR SEMICONDUCTOR MEMORY DEVICE

(75) Inventors: Yun-Sang Lee, Kyunggi-do (KR); Sang-Seok Kang, Kyunggi-do (KR); Kyu-Nam Lim, Kyunggi-do (KR); Jong-Hyun Choi, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/838,358

(22) Filed: Apr. 19, 2001

(30) Foreign Application Priority Data

Jul. 3, 2000 (KR) ........................................ 2000-37715

(51) Int. Cl.$^7$ ................................................ G11C 7/00
(52) U.S. Cl. ...................................... 365/201; 365/233
(58) Field of Search ................................ 365/201, 233, 365/189.01, 230.01

(56) References Cited

U.S. PATENT DOCUMENTS

| | | | | |
|---|---|---|---|---|
| 5,870,342 A | * | 2/1999 | Fukuda | 365/201 |
| 5,905,690 A | * | 5/1999 | Sakurai et al. | 365/233 |
| 6,061,285 A | * | 5/2000 | Tsukikawa | 365/201 |

* cited by examiner

Primary Examiner—Michael S. Lebentritt
Assistant Examiner—Anh Phung
(74) Attorney, Agent, or Firm—F. Chau & Associates, LLP

(57) ABSTRACT

A mode selection circuit for a semiconductor memory device includes a timing register for generating first and second control signals in response to a command signal and a first address signal, a programming control signal generator for generating third control signals in response to a second address signal and the first control signal, and a mode selection signal generator for generating mode selection signals in response to a master signal, the second control signal, and the third control signals, wherein the mode selection signals are activated in accordance with a sequential order of activation of the third control signals.

18 Claims, 6 Drawing Sheets

MODE SELECTION CIRCUIT FOR SEMICONDUCTOR MEMORY DEVICE

This application claims priority to Korean Patent Application No. 2000-37715, filed on Jul. 3, 2000, the contents of which in its entirety are herein incorporated by reference.

BACKGROUND OF THE INVENTION

1. Field of the Invention

The present invention relates to a semiconductor memory device, and more particularly to a mode selection circuit for providing mode selection signals obtained from address data in a semiconductor memory device.

2. Description of Related Art

Semiconductor memory devices usually have test operation modes that provide various test operations to evaluate device quality as well as normal operation modes. In a semiconductor memory device, multiple mode selection signals are provided to enable various test operations. For example, the mode selection signals may be used to activate and evaluate a device according to various voltage levels of specific circuits. The mode selection signals may be used to perform test operations including normal and abnormal operations, for example, activating multiple memory banks or word lines.

FIG. 1A shows a conventional mode selection signal generator to generate a mode selection signal in a semiconductor memory device. The mode selection signal generator includes a resistor 102 having a high resistance, a fuse 101, and two inverters 103 and 104. An activation or inactivation of a mode selection signal MODE is dependent upon whether the fuse 101 is cut off or not. If the fuse 101 is not cut off, a node N1 is low level and thereby the mode selection signal MODE remains inactive. If the fuse 101 is cut off, the node N1 is pulled-up by the resistor 102 to a high level and the mode selection signal MODE is activated.

FIG. 1B is a block diagram of another conventional mode selection signal generator. This mode selection signal generator includes a pad 110, diode-connected transistors 111, a resistor 112 having high resistance, and two inverters 113 and 114. When a high voltage is applied to the pad 110 for a mode selection, diode-connected transistors 111 are turned on, and thereby node N2 becomes high level so that a mode selection signal MODE is activated to high level. The pad 110 is used to receive external signals in a normal operation mode. A voltage level applied to the pad 110 in the normal operation mode is not enough to enable the diode-connected transistors 111 to be turned on. Thus, the node N2 maintains at a low level, and thereby the mode selection signal MODE remains inactive.

In the conventional mode selection circuit, however, additional operations are needed to cut off the fuse. Further, the conventional mode selection circuit has problems such as low reliability in cutting off the fuse and a relatively large layout size for the fuse. In addition, in case that a high voltage is applied to a pad which is employed in normal operation modes, the voltage level for the pad would be increased due to external factors such as noises to cause an invalid mode selection signal to be generated.

SUMMARY OF THE INVENTION

It is an object of the present invention to solve the above problems and to provide a mode selection circuit ensuring a stable mode selection operation so as to prevent a memory device from being situated in an invalid operation mode.

According to one aspect of the present invention to achieve the above and other objects, the mode selection circuit includes a timing register for generating a first control signal in response to a command signal and first address data, a programming control signal generator for generating second control signals in response to second address data and the first control signal, and a mode selection signal generator for generating mode selection signals in response to a master signal and the second control signals. Preferably, the mode selection signals are activated in accordance with a sequential order of activation of the second control signals.

According to another aspect of the present invention, the mode selection circuit includes a timing register for generating first and second control signals in response to command signal and a first address signal, a programming control signal generator for generating third control signals in response to a second address signal and the first control signal, and a mode selection signal generator for generating mode selection signals in response to a master signal, the second control signal, and the third control signals. The mode selection signals are preferably activated in accordance with a sequential order of activation of the third control signals. The second control signal may be activated when the command signal and the first address signal have predetermined values, and the mode selection signals are reset to an inactive state in response to the second control signal.

According to the present invention, a plurality of control signals are generated which are enabled by combinations of command signal and address signals, and mode selection signals for a specific mode are activated in accordance with a sequence of activation of the plurality of control signals. Thus, more stable mode selection operation can be carried out by the mode selection signals.

BRIEF DESCRIPTION OF THE DRAWING

The present invention will be more clearly understood from the description of the preferred embodiments as set forth below with reference to the accompanying drawings, wherein.

DETAILED DESCRIPTION OF PREFERRED EMBODIMENTS

Detailed illustrative embodiments of the present invention are disclosed herein. However, specific structural and functional details disclosed herein are merely representative for purposes of describing preferred embodiments of the present invention.

Referring to FIGS. 2 to 5B, preferred embodiments of the present invention will be described below. The suffix "B" of a signal name denotes that the signal is operable in low level.

Figure 1A:
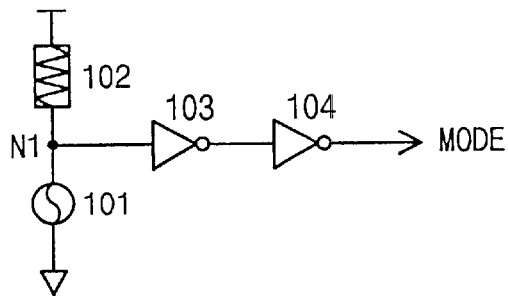
FIGS. 1A and 1B are circuit diagrams showing conventional mode selection signal generators.
Figure 1B:
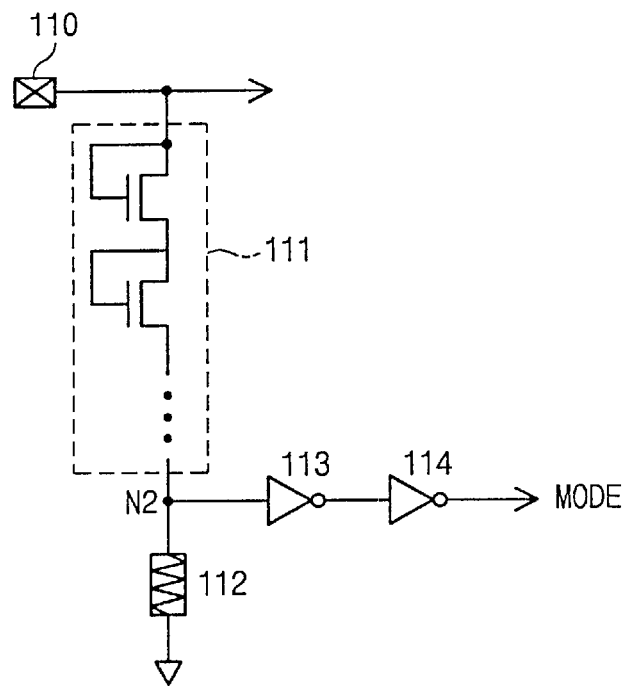
Figure 2:
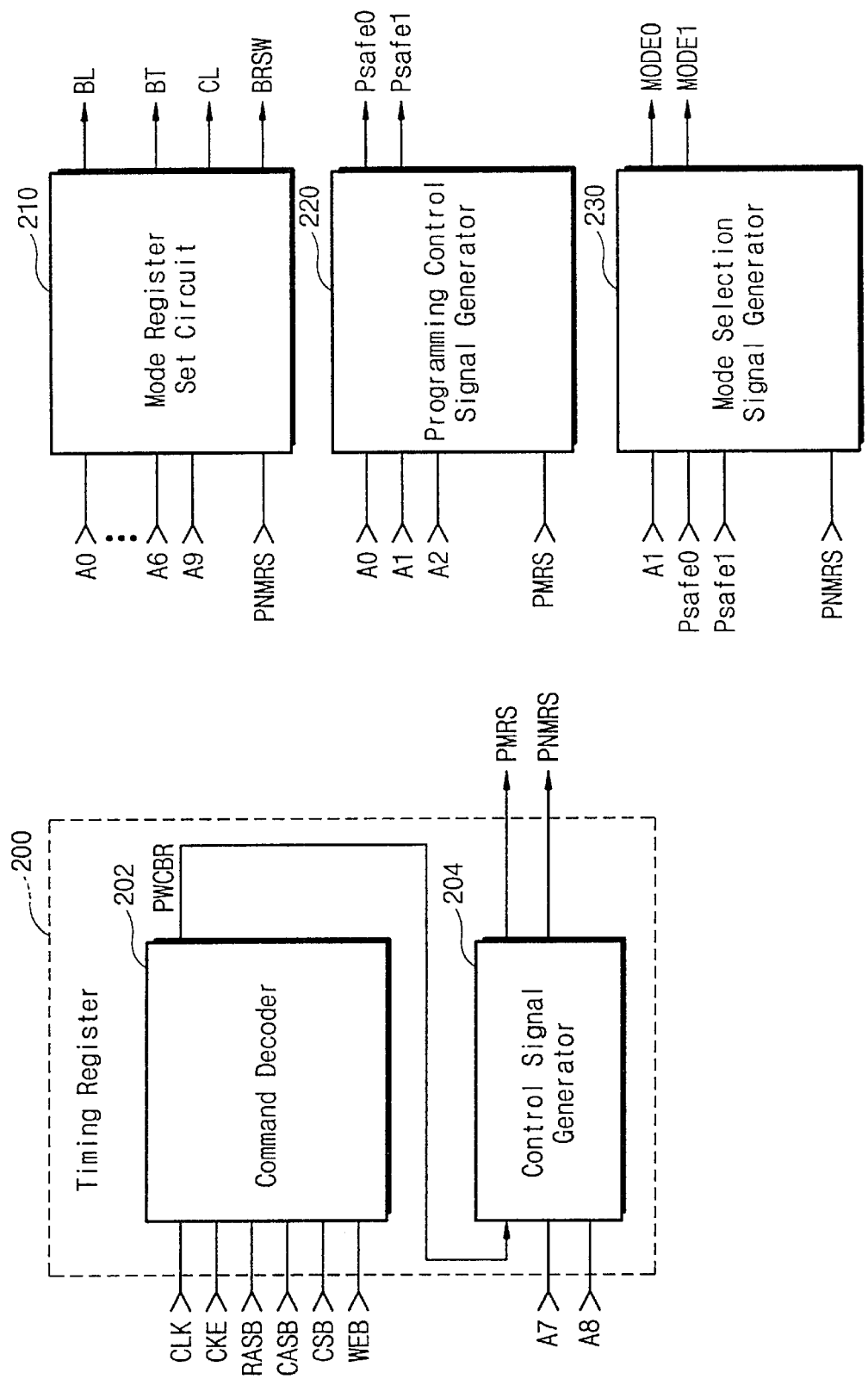
FIG. 2 is a functional block diagram showing a mode selection circuit in accordance with an embodiment of the present invention.

FIG. 2 shows an embodiment of a mode selection circuit in accordance with the invention. The mode selection circuit includes a timing register 200 with a command decoder 202 and a control signal generator 204, a mode register set (MRS) circuit 210, a programming control signal generator 220, and a mode selection signal generator 230.

The command decoder 202 receives input signals such as clock signal CLK, clock enable signal CKE, row address strobe signal RASB, column address strobe signal CASB, chip selection signal CSB, and write enable signal WEB, and then generates command signal PWCBR for the control signal generator 204. The control signal generator 204 receives the command signal PWCBR and address bits A7 and A8, and generates first test mode control signal PMRS and second test mode control signal PNMRS.

The MRS circuit 210 receives input signals including the second test mode control signal PNMRS, address bits A0, A1-A6 and A9, and generates signals to designate burst length (BL), burst type (BT), CAS latency (CL) and a burst-read/single-bit-write (BRSW) operation mode. The programming control signal generator 220 receives the first test mode control signal PMRS and address bits A0, A1 and A2, and generates switch signals Psafe0 and Psafe1. Further, the mode selection signal generator 230 receives the second test mode control signal PNMRS, the switch signals Psafe0, Psafe1 and address bit A1 acting as a master signal, and generates mode selection signals MODE0 and MODE1.

Generally, in synchronous dynamic random access memory (DRAM) devices, the mode register set (MRS) is employed to establish basic operation modes each of which is determined by combinations of command signal and addresses. Practical items for the MRS are designated in the specification of a memory device, for example, "Samsung Data Book", May 1999, published by Samsung Electronics Co., Ltd. in Korea, p. 139.

Table 1 shows various functions assigned to the address bits used at an MRS for a synchronous DRAM (SDRAM) device.

Referring to FIG. 2 again, the command decoder 202 generates the command signal PWCBR acting as a master signal for the control signal generator 204 when all the signals RASB, CASB, CSB, and WEB have a low level. The clock signal CLK and the clock enable signal CKE are generally used in synchronous devices.

When the command signal PWCBR is activated (for example, "high"), the control signal generator 204 generates the first test mode control signal PMRS or the second test mode control signal PNMRS in accordance with data of the address bits A7 and A8. Namely, when the command signal PWCBR is activated and the address bits A7 and A8 are both low levels, the second test mode control signal PNMRS is generated from the control signal generator 204. If the address bits A7 and A8 are in other states, the first test mode control signal PMRS is generated. The second test mode control signal PNMRS is used to set basic operation modes, and the first test mode control signal PMRS is used to designate mode selection signals for a test mode. To generate the first test mode control signal PMRS, the address bits A7, A8 can have any data other than low levels. In other words, when the first test mode control signal PMRS is activated, the data of the address bits A7, A8 may be any of [1, 0], [0, 1] and [1, 1], but not be [0, 0].

When the second test mode control signal PNMRS is activated, the MRS circuit 210 for setting basic operation modes generates the signals BL, BT, CL, and BRSW to designate burst length, burst type, CAS latency and burst-read/single-bit-write, respectively, in response to data of address bits A0-A6 and A9.

The command decoder 202, control signal generator 204, and MRS circuit 210 employed in this embodiment are well known in this art, thus a further detailed description thereof is omitted.

When the first test mode control signal PMRS is activated, the programming control signal generator 220 generates

TABLE 1

| Address | BA0~BA1 | An~A10/AP | A9 | A8 | A7 | A6 | A5 | A4 | A3 | A2 | A1 | A0 |
| --- | --- | --- | --- | --- | --- | --- | --- | --- | --- | --- | --- | --- |
| Function | Reserved for future use | Reserved for future use | BRSW | Test Mode | | CAS Latency | | | Burst Type | Burst Length | | |

As shown in Table 1, address bits A0 to A2 are used for designating a burst length, address bit A3 for sequential or interleaved burst type, address bits A4-A6 for CAS latency, address bits A7 and A8 for a test mode, address bit A9 for the burst read single bit write (BRSW), and other address bits BA0, BA1 and An-A10/P are reserved for designating other operation modes later.

For example, when address bits A7 and A8, i.e., [A7, A8], for designating a test mode set into [0, 0], the MRS mode is designated so that the basic operation modes are established. Other data of the address bits A7 and A8, such as [0, 1], [1, 0] and [1, 1], do not contribute to the coding for a mode selection in the specification. Further, the address bits A7 and A8 are programmed when the command signal PWCBR has specific data in association with the signals RASB, CASB, CSB, and WEB which are all, for example, low levels (This is designated in the specification).

In other words, when the signals RASB, CASB, CSB, WEB, and the address bits A7 and A8 are all low levels, the MRS mode is selected, and then other address bits determine the basic operation modes for burst length, burst type, CAS latency, and BRSW.

switch signals Psafe0 and Psafe1 in accordance with states of address bits A0, A1, and A2.

Figure 3:
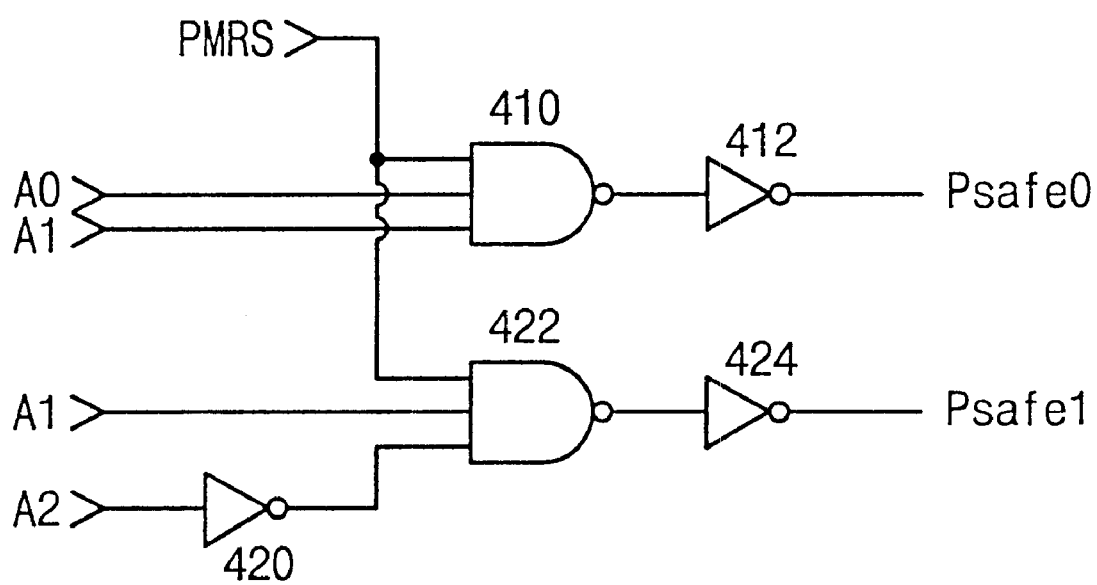
FIG. 3 is a detailed circuit diagram of a programming control signal generator of FIG. 2.

FIG. 3 is a detailed circuit diagram illustrating a preferred embodiment of the programming control signal generator 220 in FIG. 2. The programming control signal generator 220 includes a NAND gate 410 receiving the first test mode control signal PMRS and the address bits A0 and A1, an inverter 412 receiving output of the NAND gate 410 and outputting the first switch signal Psafe0, an inverter 420 receiving the address bit A2, a NAND gate 422 receiving the first test mode control signal PMRS, the address bit A1 and output of the inverter 420, and an inverter 424 receiving output of the NAND gate 422 and outputting the second switch signal Pasfe1.

When the first test mode control signal PMRS is in an activated state and the address bits A0 and A1 are both high levels, the first switch signal Psafe0 is generated to have high level. At this time, the address bit A2 should be high level to prevent the second switch signal Psafe1 from being activated at the same time. When the first test mode control signal PMRS is activated and the address bits A1 and A2 are high and low level, respectively, the second switch signal Psafe1 becomes high level. At this time, the address bit A0 should be low level to prevent the first switch signal Psafe0 from being activated at the same time. Although this embodiment describes the programming using the three address bits A0-A2 to generate the first and second switch signals Psafe0 and Psafe1, it is feasible to generate the switch signals Psafe0 and Psafe1 using logical combinations of other address bits. Also, more switch signals (including or not including the switch signals Psafe0, Psafe1) may be generated using more address bits (including or not including the address bits A0-A2).

Referring again to FIG. 2, when the address bit A1 acting as a master signal is in a specific state, the mode selection signal generator 230 generates the mode selection signal MODE0 or MODE1 in accordance with a sequential order of the activation of the switch signals Psafe0 and Psafe1. This is described in detail below. The second test mode control signal PNMRS enables the MRS circuit 210 for setting basic operation modes and simultaneously resets the mode selection signal generator 230.

Figure 4:
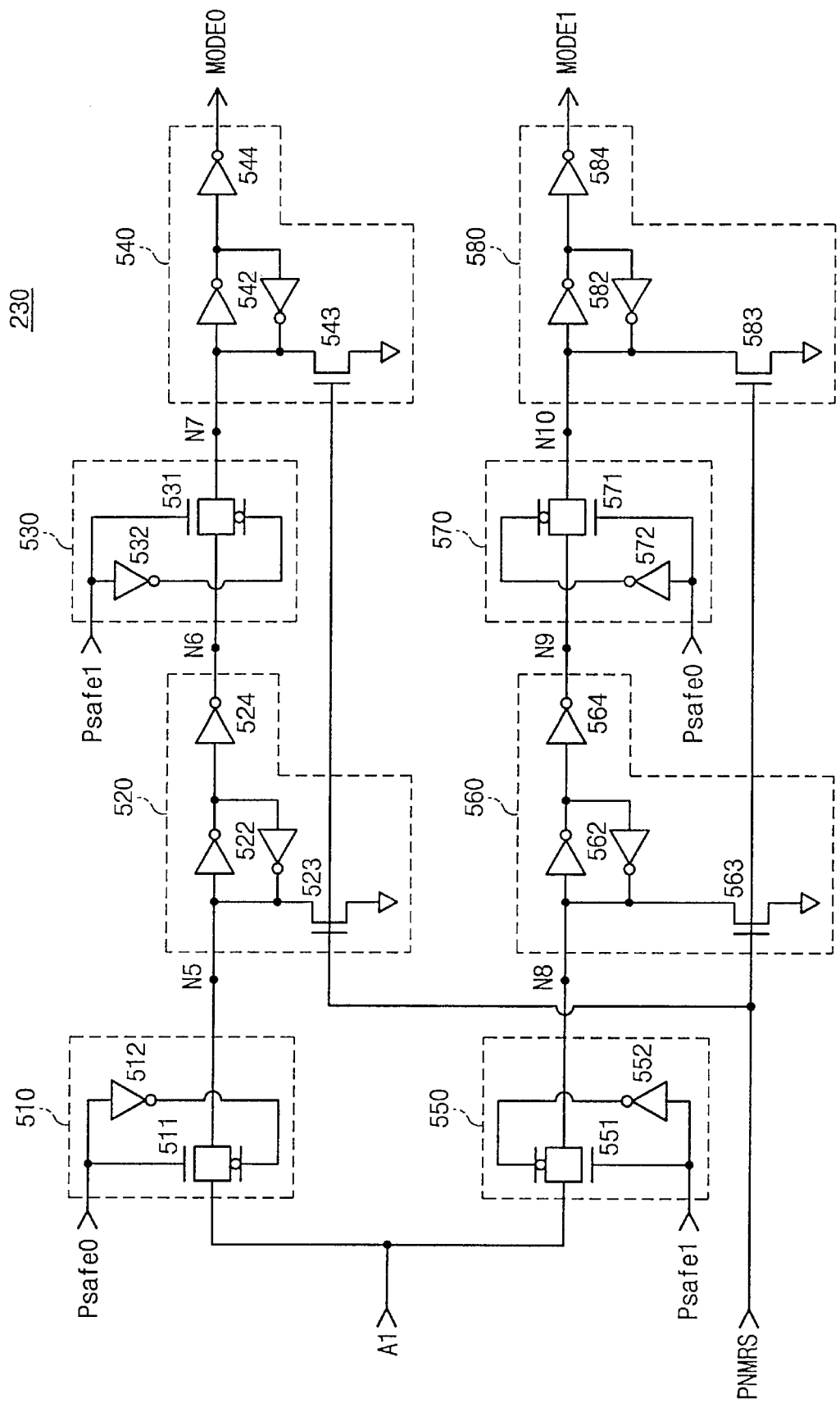
FIG. 4 is a detailed circuit diagram showing a mode selection signal generator of FIG. 2.

FIG. 4 is a detailed circuit diagram illustrating a preferred embodiment of the mode selection signal generator 230. The mode selection signal generator 230 includes transfer circuits 510 and 550 for switching address bit A1, a latch circuit 520 connected to output of the transfer circuit 510, a transfer circuit 530 connected to the latch circuit 520, a latch circuit 540 connected to output of the transfer circuit 530 and outputting a first mode selection signal MODE0, a latch circuit 560 connected to output of the transfer circuit 550, a transfer circuit 570 connected to output of the latch circuit 560, and a latch circuit 580 connected to output of the transfer circuit 570 and outputting a second mode selection signal MODE1.

The transfer circuits 510, 530, 550, and 570 include complementary metal oxide semiconductor (CMOS) pass gates 511, 531, 551, 571, respectively, and inverters 512, 532, 552, 572, respectively. The transfer circuits 510, 530, 550, and 570 are controlled by the switch signals Psafe0, Psafe1, Psafe1, and Psafe0, respectively.

The latch circuits 520, 540, 550, and 580 include latches 522, 542, 562, and 582, respectively, inverters 524, 544, 564, and 584 connected to the latches 522, 542, 562, 582, respectively, and transistors 523, 543, 563, and 583 to reset the latches 522, 542, 562, 582, respectively. Gates of the respective transistors 523, 543, 563, and 583 are controlled by the second test mode control signal PNMRS.

Figure 5A:
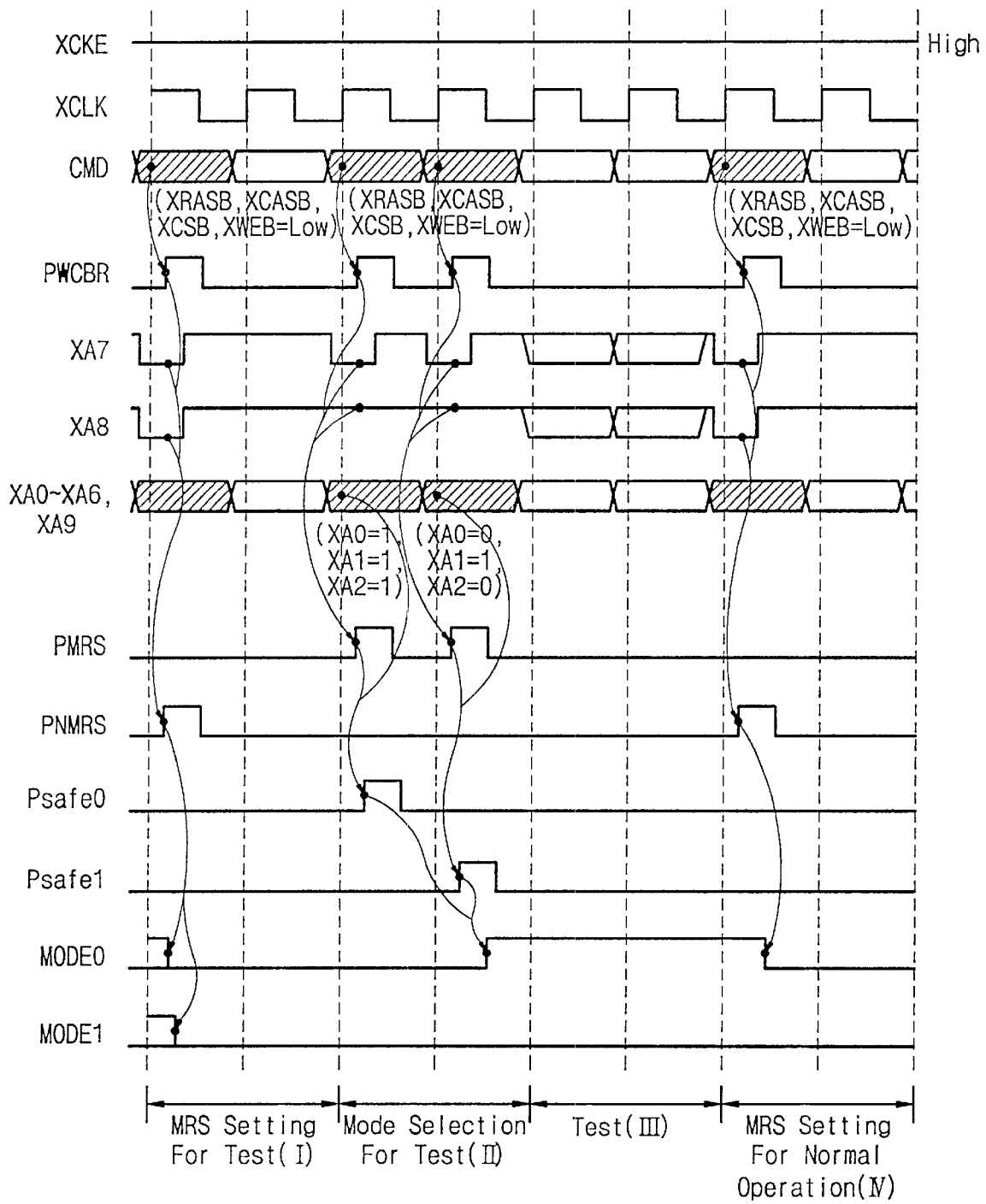
FIGS. 5A and 5B are timing diagrams for explaining the operations of the embodiment shown in FIG. 2.
Figure 5B:
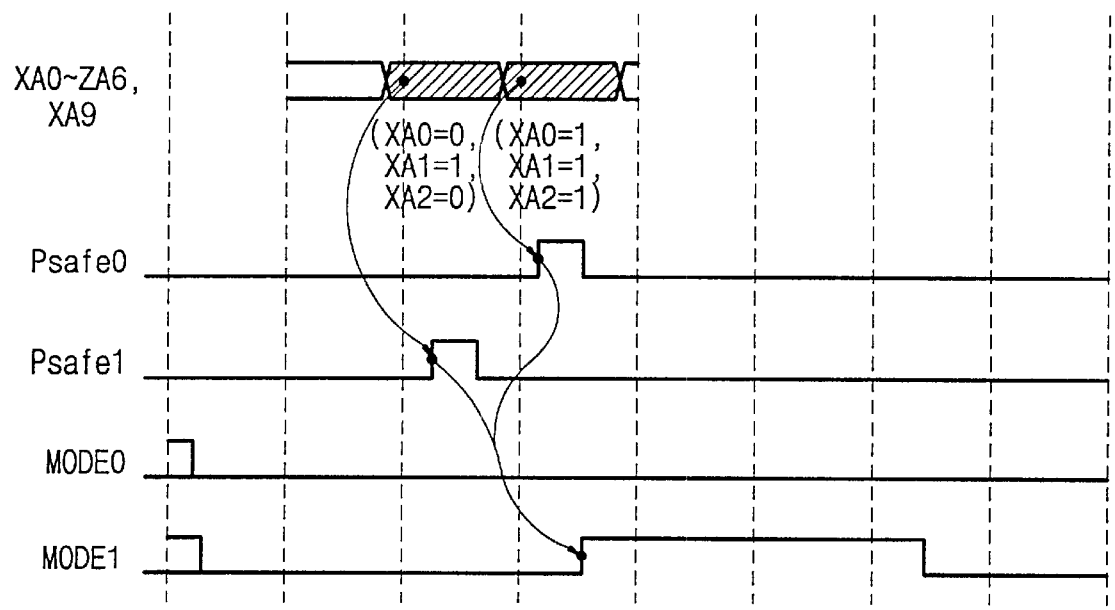

The mode selection signal generator 230 is reset by the second test mode control signal PNMRS which is activated to a high level before the mode selection signals MODE0, MODE1 are activated, so that nodes N5, N7, N8 and N10 become a low level and the mode selection signals MODE0 and MODE1 remain inactivated at a low level (referring to FIGS. 5A and 5B). If the first switch signal Psafe0 is activated (i.e., the address bits A0 and A1 are "high"), the data ("high") of the address bit A1 is routed through the transfer circuit 510 to the latch 522 to be stored therein, and then node N6 maintains high level. After that, if the second switch signal Psafe1 is activated (i.e., the address bits A1 and A2 are "high" and "low", respectively), the high level at the node N6 is routed through the transfer circuit 530 to the latch 542 to be stored therein, and then the first mode selection signal MODE0 of high level is generated from the inverter 544. In a path for generating the second mode selection signal MODE1, the second mode selection signal MODE1 is still inactivated because the data ("high") of the address bit A1 is held in the first latch circuit 560 and not transferred to the second latch circuit 580.

On the contrary, if the second switch signal Psafe1 is activated before the first switch signal Psafe0 is activated, the second mode selection signal MODE1 of high level is generated. After completing a test operation in a mode selected by the mode selection signals MODE0 and MODE1, the MRS operation is required again for normal operation modes (See FIGS. 5A and 5B). During the MRS operation, the second test mode control signal PNMRS is activated, and thereby the mode selection signals MODE0 and MODE1 from mode selection signal generator 230 are inactivated.

It should be noted that other modifications of the mode selection signal generator 230 in FIG. 4 can be readily made by those skilled in the art, for example, other address bits may be used instead of the address bit A1 as a master signal or the voltage level of the address bit A1 may be fixed to a high level such as the power supply voltage VDD. The mode selection signal generator can also generate one mode selection signal which is controlled by more switch signals Psafe by adding more transfer circuits and latch circuits, or generate more mode selection signals using more switch signals.

While, in the above embodiment, the second test mode control signal PNMRS resets the mode selection signal generator 230 before the mode selection signal generator 230 operates and after test mode operates, the second test mode control signal PNMRS can make the mode selection signal generator 230 be operable without reset control signals. For example, in case that a mode selection signal adjusts voltage level of a specific circuit, a control signal for the reset operation is not required in the mode selection signal generator. A normal mode can operate without resetting a state determined by mode selection signals. In this case, it is necessary to rest all latches of the mode selection signal generator 230 before a chip operation by means of initializing the latches. Preferably, the reset for initializing can be carried out in a process of powering up supply voltage for a chip operation. The present invention is not limited to the embodiments described above. For example, the command signal and address bits can be directly obtained from external signals and made by signals buffered from external command and address signals. Although the embodiment has been described on the basis of activation to high level, it should be understood that various changes can be made in accordance with various logics of circuit.

FIGS. 5A and 5B are timing diagrams for explaining the embodiment of FIG. 2. FIG. 5A and FIG. 5B show that the mode selection signals MODE0 and MODE1 become activated, respectively. The mode selecting operation has four stages: (I) setting MRS for test operation mode; (II) mode selection for test operation mode; (III) test operation with the MRS set in the stage (I) and the mode selected in stage (II); and (IV) setting MRS for normal operation modes.

The stage (I) of FIG. 5A is a process of setting basic operation modes for the test operation mode by MRS operation. In an activated state of external clock enable signal XCKE, when external row address strobe signal XRASB, external column address strobe signal XCASB, external chip selection strobe signal XCSB, and external write enable signal XWEB (these signals are inputted in synchronization with the external clock signal XCLK) are low levels, command signal PWCBR is activated. Since external address bits XA7 and XA8 are low levels, the second test mode control signal PNMRS is activated to disable the mode selection signals MODE0 and MODE 1. At the same time, basic factors for the test operations, burst length, burst type, and CAS latency, etc. are established by address bits XA0-XA6 and XA9. After that, another clock cycle is required because two clock cycles are basically needed for programming using MRS as designated in the specification.

The stage (II) is for selecting a mode to be used in the test operation mode. At the stage (II), when address bits XA7 and XA8 are low and high levels, respectively, and the signals XRASB, XCASB, XCSB and XWEB are low levels, the first test mode control signal PMRS as a master signal for generating the switch signals Psafe are activated. When the first test mode control signal PMRS is activated, the switch signals Psafe0, Psafe1 are activated in sequence in response to the combination of the address bits A0-A2. For example, the first switch signal Psafe0 is activated when the address bits A0-A2 are [1, 1, 1], and the second switch signal Psafe1 is activated when the address bits A0-A2 are [0, 1, 0]. As a result, the first mode selection signal MODE0 is activated.

In the stage (III), the test mode is performed with the MRS set in the stage (I) and the mode set in the stage (II). At the stage (III), the first mode selection signal MODE0 maintains the activated state.

In the stage (IV), basic operation modes for normal operation are set by the MRS operation. At the stage (IV), the second test mode control signal PNMRS is activated, and thereby the first mode selection signal MODE0 activated for the test operation becomes inactive.

FIG. 5B is a timing diagram illustrating an activation of the second mode selection signal MODE1 in association with the switch signals Psafe0, Psafe1 and the address data A0-A2. For the sake of convenience, FIG. 5B shows only parts different from those in FIG. 5A. Compared with the activation of the first mode selection signal MODE0, the second mode selection signal MODE1 is activated when the first switch signal Psafe0 is activated before the second switch signal Psafe1 is activated. While the values of the combinations of the address bits A0, A1, and A2 in FIG. 5B are same as those in FIG. 5A, the sequential order of the combinations in FIG. 5B is different from that in FIG. 5A. In other words, in FIG. 5B the combination [0, 1, 0] precedes the combination [1, 1, 1]. As a result, after the second switch signal Psafe1 is activated, the first switch signal Psafe0 is activated in the next cycle, and thereby the second mode selection signal MODE1 is activated.

According to the present invention, a plurality of control signals enabled by combinations of command signal and address signals are generated, and then mode selection signals for a specific mode operation is enabled in accordance with a sequential order in the activation of the plurality of control signals. Since the control signals are operable by a digital method, many devices are free from being situated in an invalid operation mode. Thus, more stable mode selection operation can be conducted by the mode selection signals.

What is claimed is:

1. A mode selection circuit for a semiconductor memory device, including:
   a circuit for generating a plurality of control signals in response to a test mode control signal and address data; and
   a circuit for generating at least one mode selection signal in response to said plurality of control signals,
   wherein activation of said at least one mode selection signal is determined in accordance with a sequential order of activation of said plurality of control signals.

2. The mode selection circuit according to claim 1, further including a timing register for generating test mode control signals which are activated in response to a command signal and second address data.

3. The mode selection circuit according to claim 2, wherein said command signal has information of a row address strobe signal, a column address strobe signal, a chip enable signal, and a write enable signal for said semiconductor memory device.

4. The mode selection circuit according to claim 2, wherein said timing register provides a second test mode control signal to said circuit for generating at least one mode selection signal to reset said at least one mode selection signal.

5. The mode selection circuit according to claim 4, wherein said at least one mode selection signal includes first and second mode selection signals, said first mode selection signal being activated when a first control signal is activated in a first clock period and a second control signal is activated in a second clock period, said second mode selection signal being activated when the second control signal is activated in the first clock period and the first control signal is activated in the second clock period.

6. The mode selection circuit according to claim 1, wherein said plurality of control signals are activated in such a manner that one control signal is activated within one clock period.

7. A mode selection circuit, comprising:
   a timing register for generating a first control signal in response to a command signal and first address data;
   a programming control signal generator for generating second control signals in response to second address data and said first control signal; and
   a mode selection signal generator for generating mode selection signals in response to a master signal and said second control signals,
   wherein said mode selection signals are activated in accordance with a sequential order of activation of said second control signals.

8. The mode selection circuit according to claim 7, wherein said command signal has information of a row address strobe signal, a column address strobe signal, a chip enable signal, and a write enable signal.

9. The mode selection circuit according to claim 7, wherein said first control signal activates said programming control signal generator when said command signal and said first address data have predetermined values, and each of said second control signals is activated according to a value of said second address data.

10. The mode selection circuit according to claim 9, wherein said second control signals are activated in such a manner that one second control signal is activated within one clock period.

11. The mode selection circuit according to claim 9, wherein said programming control signal generator includes:
   a first logic circuit for receiving said first control signal and said second address data to output a second control signal obtained by performing a first logic operation with respect to said first control signal and said second address data; and
   a second logic circuit for receiving said first control signal and said second address data to output another second control signal obtained by performing a second logic operation with respect to said first control signal and said second address data.

12. The mode selection circuit according to claim 7, wherein said timing register generates a third control signal to said mode selection signal generator to reset said mode selection signals.

13. A mode selection circuit, comprising:
- a timing register for generating first and second control signals in response to a command signal and a first address signal;
- a programming control signal generator for generating third control signals in response to a second address signal and said first control signal; and
- a mode selection signal generator for generating mode selection signals in response to a master signal, said second control signal, and said third control signals,
- wherein said mode selection signals are activated in accordance with a sequential order of activation of said third control signals.

14. The mode selection circuit according to claim 13, wherein said command signal has information including a row address strobe signal, a column address strobe signal, a chip enable signal, and a write enable signal.

15. The mode selection circuit according to claim 13, wherein said first control signal activates said programming control signal generator when said command signal and said first address signal have a first set of values;
said second control signal is activated when said command signal and said first address signal have a second set of values, said mode selection signals being reset to an inactive state in response to said second control signal; and
each of said third control signals is activated according to data of said second address signal.

16. The mode selection circuit according to claim 13, wherein said third control signals are activated in such a manner that a third control signal is activated within one clock period.

17. The mode selection circuit according to claim 13, wherein said mode selection signal generator includes:
- first transfer circuits each for transferring data of said master signal in response to one of said third control signals;
- first latch circuits each for storing output data of a corresponding one of said first transfer circuits;
- second transfer circuits each for transferring output data of a corresponding one of said first latch circuits in response to anther signal of said third control signals; and
- second latch circuits each for storing output data of a corresponding one of said second transfer circuits and for generating a corresponding one of said mode selection signals.

18. The mode selection circuit according to claim 17, wherein said first latch circuits and said second latch circuits are reset in response to said second control signal so that said mode selection signals are inactivated.

* * * * *